US 12,387,915 B2

(12) United States Patent
Kim et al.

(10) Patent No.: US 12,387,915 B2
(45) Date of Patent: Aug. 12, 2025

(54) LOWER PLASMA EXCLUSION ZONE RING FOR BEVEL ETCHER

(71) Applicant: LAM RESEARCH CORPORATION, Fremont, CA (US)

(72) Inventors: Keechan Kim, Livermore, CA (US); Jack Chen, San Francisco, CA (US); Gregory S. Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 600 days.

(21) Appl. No.: 17/283,048

(22) PCT Filed: Oct. 16, 2019

(86) PCT No.: PCT/US2019/056472
§ 371 (c)(1),
(2) Date: Apr. 6, 2021

(87) PCT Pub. No.: WO2020/081644
PCT Pub. Date: Apr. 23, 2020

(65) Prior Publication Data
US 2021/0351018 A1    Nov. 11, 2021

Related U.S. Application Data

(60) Provisional application No. 62/747,226, filed on Oct. 18, 2018.

(51) Int. Cl.
*H01J 37/32*     (2006.01)
*H01L 21/687*    (2006.01)

(52) U.S. Cl.
CPC .. *H01J 37/32642* (2013.01); *H01J 37/32568* (2013.01); *H01J 37/32798* (2013.01);
(Continued)

(58) Field of Classification Search
None
See application file for complete search history.

(56) References Cited

U.S. PATENT DOCUMENTS 6,344,105 B1    2/2002  Daugherty et al.
2005/0005859 A1 1/2005  Koshiishi et al.
(Continued)

FOREIGN PATENT DOCUMENTS

CN    101589457 A    11/2009
CN    202221752 U     5/2012
(Continued)

OTHER PUBLICATIONS

Merriam-Webster dictionary definition "step" (Year: 2024).*
(Continued)

*Primary Examiner* — Parviz Hassanzadeh
*Assistant Examiner* — Laureen Chan

(57) ABSTRACT

A substrate processing system for processing a substrate includes an upper plasma exclusion zone ring arranged above a substrate during plasma treatment of a bevel edge of the substrate. An upper electrode is arranged above the substrate during plasma treatment. A lower plasma exclusion zone ring is at least partially arranged below the substrate during the plasma treatment. A lower electrode is at least partially arranged below the substrate during plasma treatment. The lower plasma exclusion zone ring includes an annular body with a lower portion at least partially arranged below the substrate and an upwardly projecting flange extending upwardly from the lower portion of the annular body at a location spaced from a radially outer edge of the substrate. The upwardly projecting flange includes an uppermost surface extending to one of a middle portion of the substrate in a vertical direction and above the middle portion of the substrate.

58 Claims, 5 Drawing Sheets

(52) U.S. Cl.
CPC .. *H01L 21/68735* (2013.01); *H01J 2237/332* (2013.01); *H01J 2237/334* (2013.01)

(56) References Cited

U.S. PATENT DOCUMENTS

| | | | | |
|---|---|---|---|---|
| 2008/0182412 | A1* | 7/2008 | Bailey, III | H01L 21/0209 156/345.43 |
| 2009/0218560 | A1* | 9/2009 | Flaim | H01L 21/6835 438/692 |
| 2009/0325382 | A1 | 12/2009 | Yu et al. | |
| 2011/0206833 | A1* | 8/2011 | Sexton | H01J 37/32862 427/78 |
| 2013/0000848 | A1* | 1/2013 | Wongsenakhum | H01L 21/68735 156/345.34 |
| 2014/0262026 | A1* | 9/2014 | Forster | B05C 21/005 118/504 |
| 2015/0013906 | A1* | 1/2015 | Fischer | H01J 37/32366 156/345.24 |
| 2016/0099162 | A1* | 4/2016 | Ng | H01J 37/32642 269/302 |
| 2017/0011891 | A1 | 1/2017 | Hammond, IV et al. | |
| 2017/0256435 | A1* | 9/2017 | Joubert | H01L 21/68735 |
| 2019/0214249 | A1* | 7/2019 | Su | H01L 21/02087 |

FOREIGN PATENT DOCUMENTS

| | | | |
|---|---|---|---|
| CN | 104517829 A | | 4/2015 |
| JP | 2003229408 A | | 8/2003 |
| JP | 2011014943 A | | 1/2011 |
| JP | 3168689 U | | 6/2011 |
| KR | 20090044571 A | * | 5/2009 ......... H01L 21/3065 |

OTHER PUBLICATIONS

Merriam-Webster dictionary definition "pocket" (Year: 2024).*
Merriam-Webster dictionary definition "ridge" (Year: 2024).*
Merriam-Webster Dictionary definition "flange" (Year: 2024).*
English Machine translation of Lee et al. (KR20090044571A) retrieved from ESPACENET Jul. 1, 2024. (Year: 2004).*
Merriam-Webster Dictionary definition of taper retrieved from https://www.merriam-webster.com/taper Jul. 10, 2024 (Year: 2024).*
Merriam-Webster Dictionary Definition of "underneath" retrieved from https://www.merriam-webster.com/underneath on Jul. 2, 2024 (Year: 2024).*
International Search Report and Written Opinion of the ISA issued in PCT/US2019/056472, mailed Mar. 13, 2020; ISA/KR.
Office Action issued in corresponding Japanese Patent Application 2021-520122 dated Oct. 31, 2023.
Office Action issued in corresponding Chinese Patent Application 201980068405X dated May 30, 2024.

* cited by examiner

LOWER PLASMA EXCLUSION ZONE RING FOR BEVEL ETCHER

CROSS-REFERENCE TO RELATED APPLICATIONS

This application is a U.S. National Phase Application under 35 U.S.C. 371 of International Application No. PCT/US2019/056472, filed on Oct. 16, 2019, which claims the benefit of U.S. Provisional Application No. 62/747,226, filed on Oct. 18, 2018. The entire disclosures of the applications referenced above are incorporated herein by reference.

FIELD

The present disclosure relates to substrate processing systems and more particularly to a lower plasma exclusion zone ring for a bevel etcher.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, cleaning and/or other treatment of substrates such as semiconductor wafers. During processing, a substrate is arranged on a substrate support, such as a pedestal, an electrostatic chuck (ESC), etc. in a processing chamber of the substrate processing system. A process gas mixture is introduced into the processing chamber to treat the substrate. The process gas mixture may include precursors for deposition or etch gases for etching. Plasma may be struck to enhance chemical reactions within the processing chamber. An RF bias may be supplied to the substrate support to control ion energy.

During processing of a substrate, multiple film layers are deposited onto the substrate. Plasma may be used after deposition to etch certain portions of film previously deposited on the substrate. In some situations, etch plasma density may be lower near an edge of the substrate. As a result, accumulation of film or a byproduct layer may occur on the top and bottom surfaces of a bevel edge of the substrate.

Over time, bonds between one or more byproduct layers and the substrate may weaken and the byproduct layers may peel or flake off. For example, the particles that are created may fall off during substrate transport and may contaminate other substrates, which may cause defects. Substrate processing systems for etching or cleaning the bevel edge are used to remove the byproduct layers.

SUMMARY

A substrate processing system for processing a substrate includes an upper plasma exclusion zone ring arranged above a substrate during plasma treatment of a bevel edge of the substrate. An upper electrode is arranged above the substrate during plasma treatment. A lower plasma exclusion zone ring is at least partially arranged below the substrate during the plasma treatment. A lower electrode is at least partially arranged below the substrate during plasma treatment. The lower plasma exclusion zone ring includes an annular body with a lower portion at least partially arranged below the substrate and an upwardly projecting flange extending upwardly from the lower portion of the annular body at a location spaced from a radially outer edge of the substrate. The upwardly projecting flange includes an uppermost surface extending to one of a middle portion of the substrate in a vertical direction and above the middle portion of the substrate.

In other features, the lower electrode is located at least partially below the lower plasma exclusion zone ring. The lower plasma exclusion zone ring includes a plurality of annular steps arranged on a substrate-facing surface thereof. The uppermost surface of the upwardly projecting flange is planar.

In other features, an arcuate surface extends downwardly from a radially inner edge of the uppermost surface to a location adjacent to an apex of the substrate. An arcuate surface extends downwardly from a radially inner edge of the uppermost surface to the lower portion of the annular body.

In other features, a gap is defined in a horizontal plane between an apex of the substrate and a radially inner surface of the upwardly projecting flange. The gap has a width in a range from 0.1 to 1 mm. The width is in a range from 0.1 to 0.5 mm.

In other features, the uppermost surface is located in a plane parallel to a plane including an upper surface of the substrate. A thickness of the substrate is in a range from 50 microns to 2 mm. The lower plasma exclusion zone (PEZ) ring is made of a material selected from a group consisting of alumina and yttria.

In other features, the substrate is attached to a carrier substrate. The upwardly projecting flange of the lower plasma exclusion zone ring defines an upper pocket located radially inwardly from the uppermost surface and a lower pocket located radially inwardly from the upper pocket.

In other features, an annular ridge, located between the upper pocket and the lower pocket, is arranged at or above an apex of a radially outer edge of the substrate.

A lower plasma exclusion zone ring for a bevel etcher includes an annular body defining a first annular step located below and radially inwardly of a radially outer edge of a substrate and a second annular step extending upwardly and radially outwardly from the first annular step. A transition between the first annular step and the second annular step is located radially inwardly of the radially outer edge of the substrate. An upwardly projecting flange extends upwardly from an upper surface of the second annular step at a location radially outside of the substrate. An uppermost surface of the upwardly projecting flange extends upwardly from an upper surface of the second annular step to a location vertically adjacent to at least one of a middle portion of the substrate and above the middle portion of the substrate.

In other features, the uppermost surface of the upwardly projecting flange lies in a plane parallel to a plane including an upper surface of the substrate. An arcuate surface extends downwardly and inwardly from a radially inner edge of the upwardly projecting flange to a location adjacent to an apex of the substrate.

In other features, an arcuate surface extends downwardly and inwardly from a radially inner edge of the upwardly projecting flange to an upper surface of the second annular step.

In other features, a gap is defined in a horizontal plane between an apex of the substrate and a radially inner surface of the upwardly projecting flange. The gap has a width in a range from 0.1 to 1 mm. The width is in a range from 0.1 to 0.5 mm. A thickness of the substrate is in a range from 50 microns to 2 mm. The annular body is made of a material selected from a group consisting of alumina and yttria.

A lower plasma exclusion zone ring for a bevel etcher includes an annular body defining a first annular step configured to support a lower electrode of the bevel etcher, a second annular step extending upwardly and radially outwardly from the first annular step and configured to support a substrate, and a third annular step extending upwardly and radially outwardly from the second annular step. A radially inner surface of the third annular step defines a first pocket, a second pocket located radially inwardly from and below the first pocket, and an annular ridge located between the first pocket and the second pocket.

In other features, the second pocket is configured to support the substrate and the annular ridge is located at or above an apex of a radially outer edge of the substrate. An uppermost surface of the third annular step lies in a plane parallel to a plane including an upper surface of the substrate. A gap is defined in a horizontal plane between an apex of the substrate and the annular ridge. The gap has a width in a range from 0.1 to 1 mm. The width is in a range from 0.1 to 0.5 mm. A thickness of the substrate is in a range from 50 microns to 2 mm. The annular body is made of a material selected from a group consisting of alumina and yttria.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

As was described above, a substrate processing system for etching a bevel edge of a substrate is typically designed to etch a radially outer edge of the substrate (and to not etch radially inner portions of the substrate). In other words, the substrate processing system etches an upper surface of the substrate near a radially outer edge of the substrate, a bevel edge of the substrate and a lower surface of the substrate near the radially outer edge of the substrate. The bevel etcher typically removes byproduct layers or other film from these surfaces. Radially inner portions of the substrate are not etched.

In some applications, it is desirable to perform etching of the substrate above an apex of the bevel edge but not below an apex of the bevel edge. In other applications, the substrate includes a first substrate attached to an underlying carrier substrate. Etching of the first substrate is performed to trim the first substrate while limiting etching of the carrier substrate.

Figure 1:
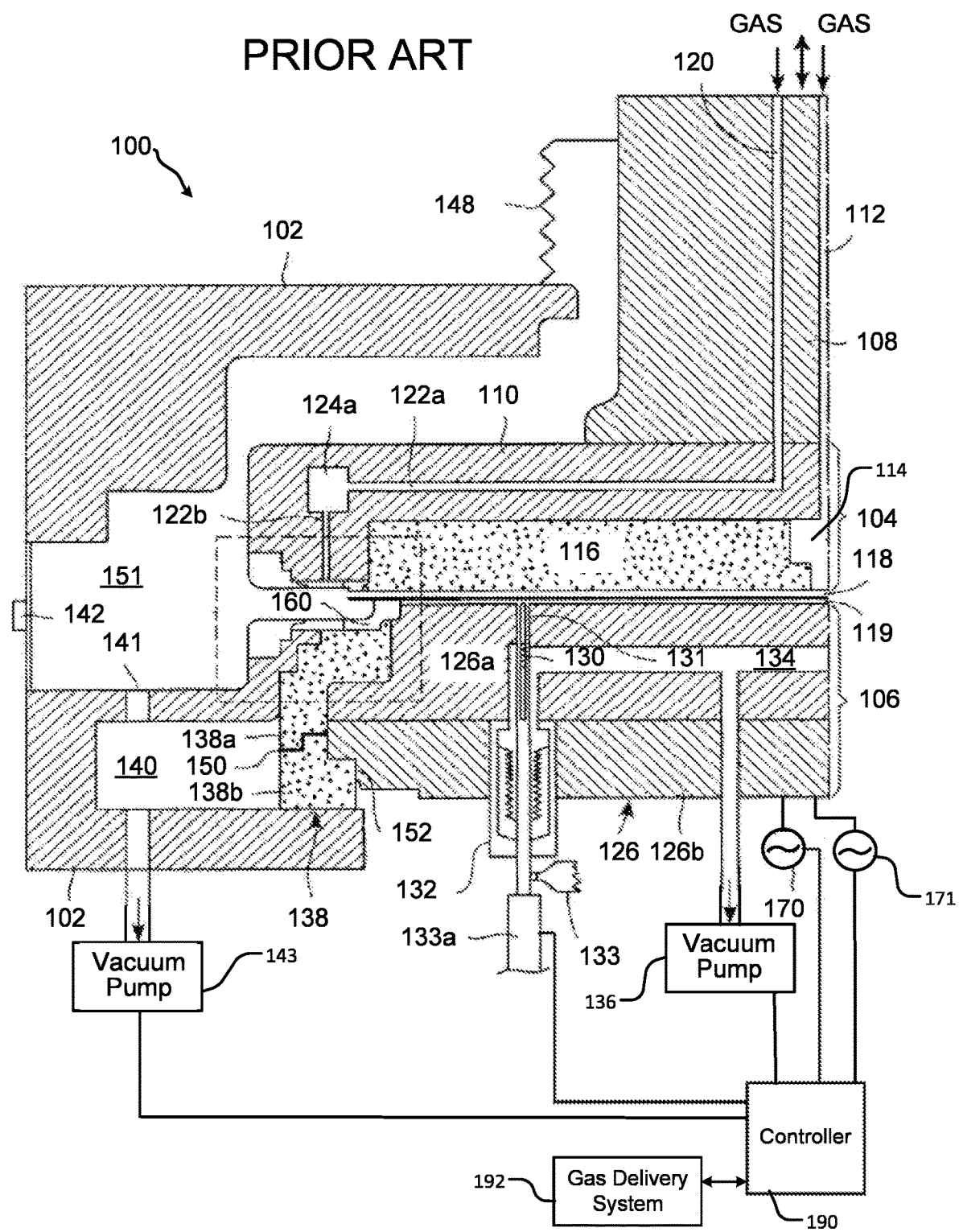
FIG. 1 is a side cross-sectional view of an example of a portion of a substrate processing system.
Figure 2:
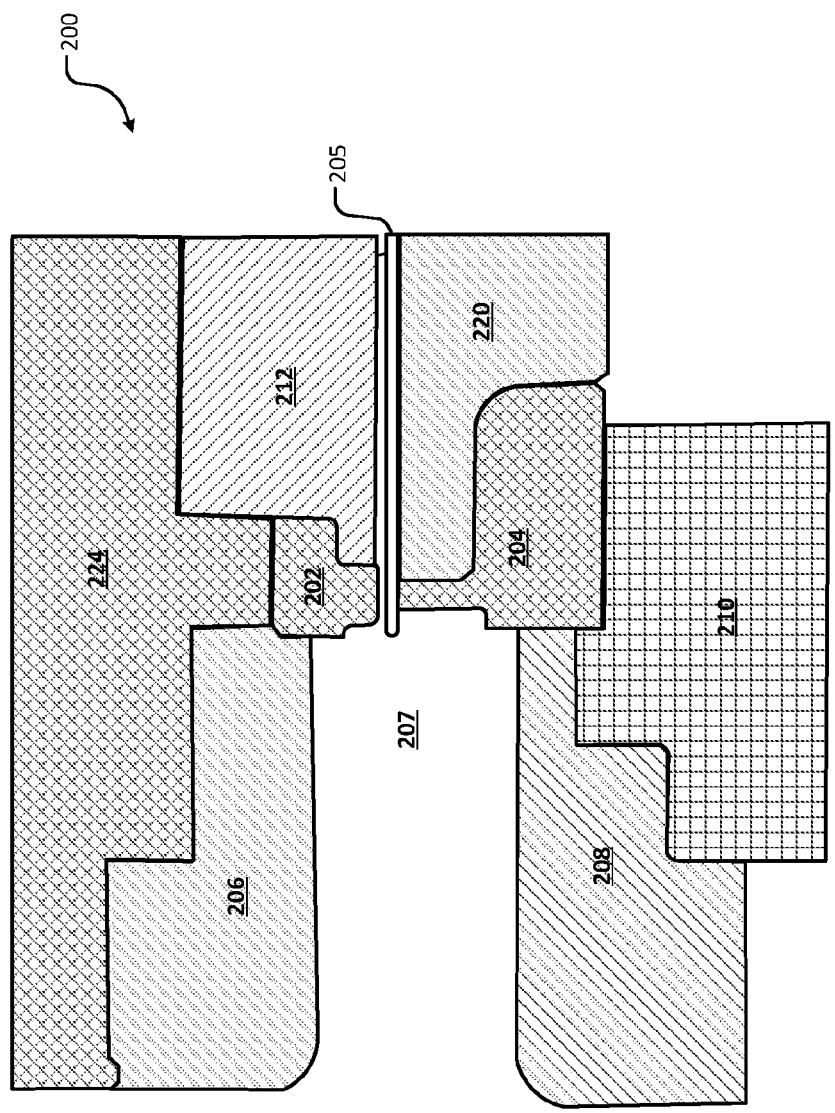
FIG. 2 is an enlarged side cross-sectional view of an example of a bevel etcher with upper and lower plasma exclusion zone rings.
Figure 3:
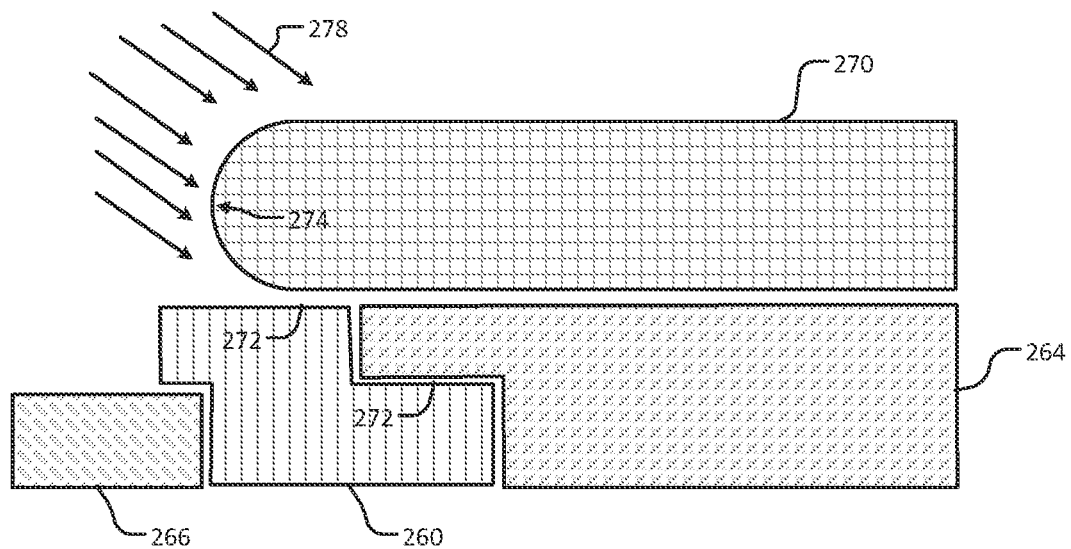
FIG. 3 is a side cross-sectional view of an example of a substrate, a lower plate and a lower plasma exclusion zone ring according to the present disclosure.

In the description below, a conventional bevel etcher for etching or cleaning a bevel edge of a substrate is shown (FIG. 1). In FIG. 2, another configuration of electrodes and plasma exclusion zone rings is shown for a bevel etcher. In FIG. 3, a lower plasma exclusion zone (PEZ) ring is modified and arranged in close proximity to a bottom surface of the substrate (near a radially outer edge thereof) to reduce etching of the bottom surface of the substrate.

Figure 4:
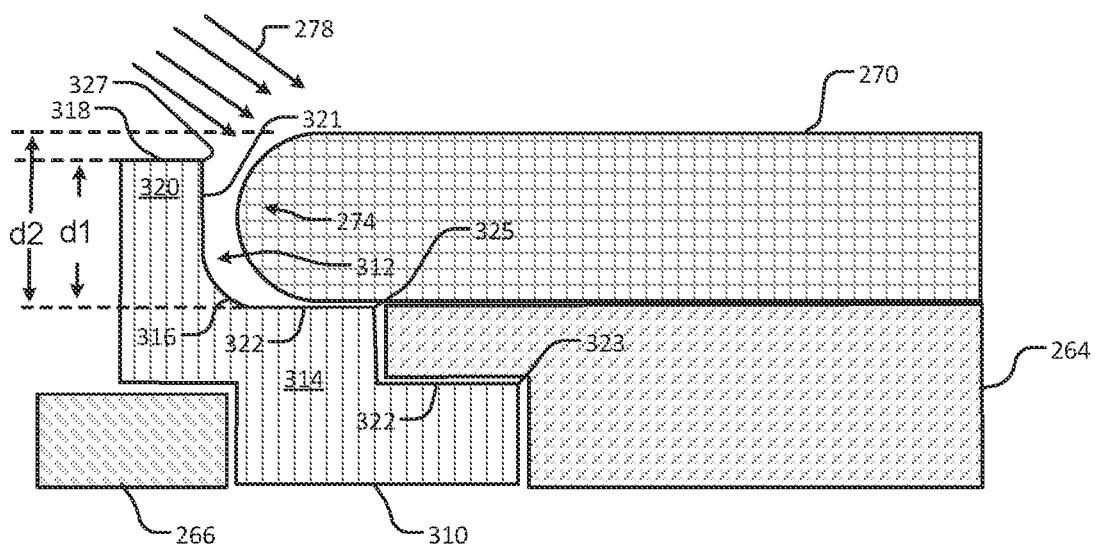
FIGS. 4 and 5 are side cross-sectional views of other examples of substrates, a lower plate and a lower plasma exclusion zone ring according to the present disclosure.
Figure 5:
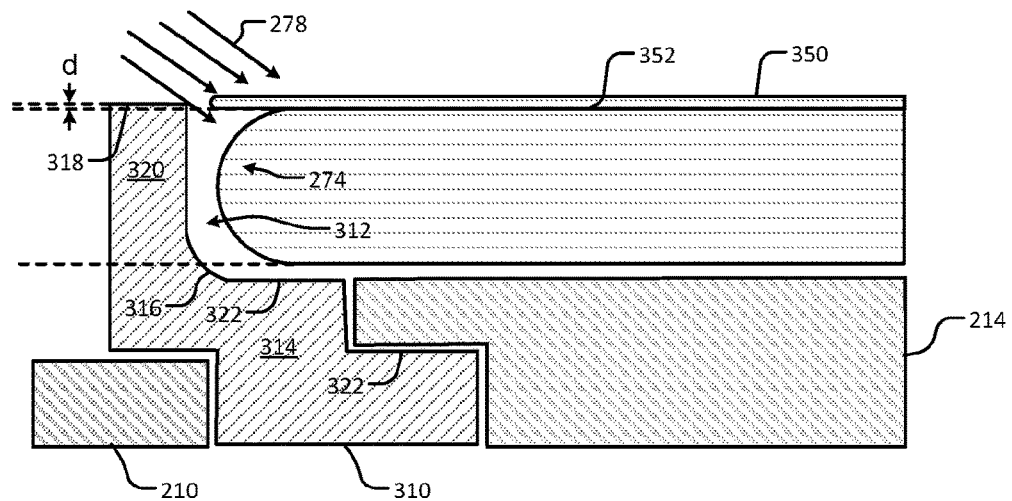
Figure 6:
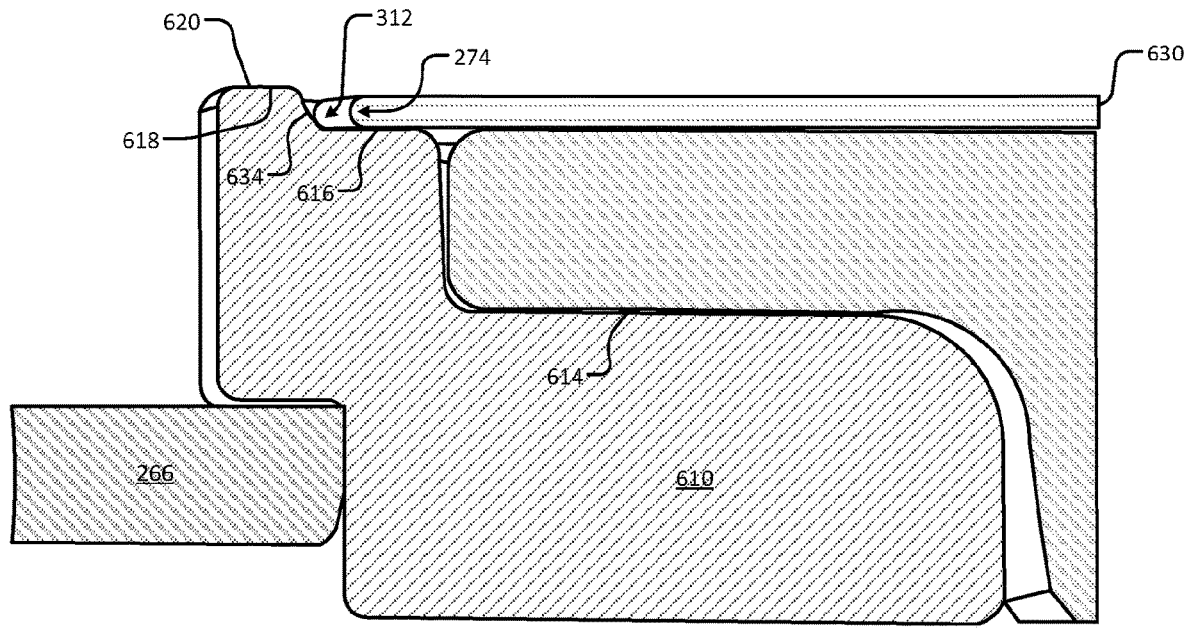
FIGS. 6 and 7 are side cross-sectional views of additional examples of substrates, lower plates and lower plasma exclusion zone rings according to the present disclosure.
Figure 7:
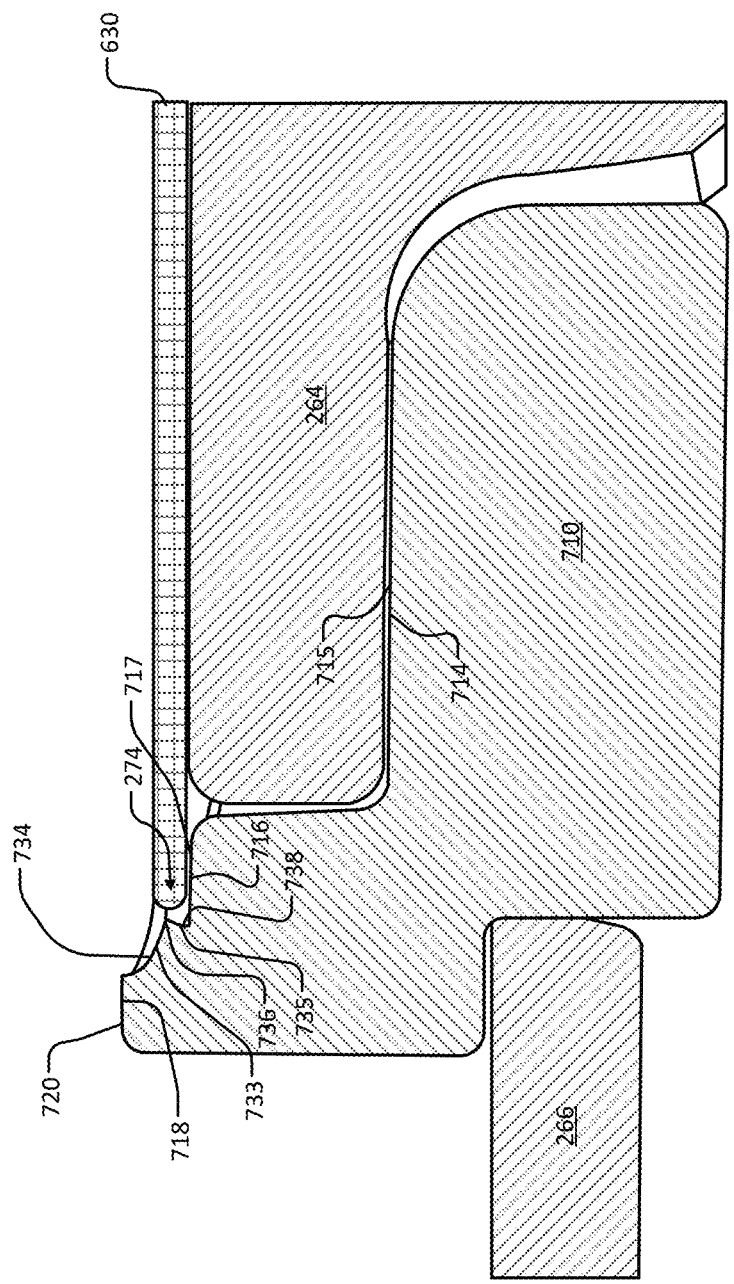

In FIGS. 4 and 5, the lower PEZ ring extends upwardly near a radially outer edge of the substrate to a location that is at or above an apex of the substrate (generally at a middle portion of the substrate in a vertical direction) or an upper surface of the substrate according to the present disclosure. FIGS. 6 and 7 illustrate additional variations for the lower PEZ ring.

Referring now to FIG. 1, a substrate processing system 100 for cleaning a bevel edge of a substrate 118 is shown. The substrate processing system 100 includes a chamber wall 102 having a gate 142 through which a substrate 118 is loaded/unloaded. An upper electrode assembly 104 is connected to a support 108. The substrate processing system 100 includes a lower electrode assembly 106. An actuator (not shown) is attached to the support 108 for moving the upper electrode assembly 104 up and down (in the direction of the double arrow) to adjust the gap between the upper electrode assembly 104 and the substrate 118.

Metal bellows 148 form a vacuum seal between the chamber wall 102 and support 108 while allowing the support 108 to move vertically relative to the chamber wall 102. The support 108 has a center gas feed (passage) 112 and an edge gas feed (passage) 120. One or both gas feeds 112, 120 can deliver a plasma gas mixture to clean the bevel edge and/or to deposit a thin film thereon.

During operation, the plasma is formed around the bevel edge of the substrate 118 and is generally ring shaped. To prevent the plasma from reaching the central portion of the substrate 118, the space between a dielectric plate 116 on the upper electrode assembly 104 and the substrate 118 is small and the process gas is fed from the center feed (for example, through a stepped hole 114. Then, the gas passes through the gap between the upper electrode assembly 104 and the substrate 118 in the radial direction of the substrate.

In some examples, the purge gas is injected through the center gas feed 112, while the process gas is injected through the edge gas feed 120. The plasma/process gas is withdrawn from the chamber space 151 to the bottom space 140 via a plurality of holes (outlets) 141. In some examples, a vacuum pump 143 can be used to evacuate the bottom space 140 during a cleaning or deposition operation.

The upper electrode assembly 104 includes an upper dielectric plate 116 and an upper metal component 110 secured to the support 108 by a suitable fastening mechanism and grounded via the support 108. The upper metal component 110 has one or more edge gas passageways or through holes 122a, 122b and an edge gas plenum 124a. The edge gas passageways or through holes 122a, 122b are coupled to the edge gas feed 120 for fluid communication during operation. The upper dielectric plate 116 is attached to the upper metal component 110.

The lower electrode assembly 106 includes powered electrode 126 having an upper portion 126a and a lower portion 126b. A pin operating unit 132 and lift pins 130 move the substrate 118 up and down. A bottom dielectric ring 138 includes an upper portion 138a and a lower portion 138b. In some examples, the chuck includes an electrostatic chuck or a vacuum chuck. Hereinafter, the term powered electrode refers to one or both of the upper and lower portions 126a, 126b. Likewise, the term bottom dielectric ring 138 refers to one or both of the upper and lower portions 138a, 138b. The powered electrode 126 is coupled to one radio frequency (RF) power source 170 or two frequency (RF) power sources 170 and 171 to receive RF power during operation.

The lift pins 130 move vertically within cylindrical holes or paths 131 and are moved between upper and lower positions by the pin operating unit 132 positioned in the powered electrode 126. The pin operating unit 132 includes a housing around each lift pin to maintain a vacuum sealed environment around the pins. The pin operating unit 132 includes any suitable lift pin mechanism, such as a robot 133 (e.g., a horizontal arm having segments extending into each housing and attached to each pin) and an arm actuating device (not shown) and with a pin guide assembly 133a.

The substrate 118 is mounted on the lower electrode or on a lower configurable plasma-exclusion-zone (PEZ) ring 160. The term PEZ refers to a radial distance from the center of the substrate to the outer edge of the area where the plasma for cleaning the bevel edge is to be excluded. In an embodiment, the top surface of the powered electrode 126, the bottom surface of the substrate 118, and inner periphery of the lower configurable PEZ ring 160 can form an enclosed vacuum region recess (vacuum region) 119 in fluid communication with a vacuum source such as a vacuum pump 136. The cylindrical holes or paths for the lift pins 130 are also shared as gas passageways, through which the vacuum pump 136 evacuates the vacuum region 119 during operation. The powered electrode 126 includes a plenum 134 to reduce temporal pressure fluctuations in the vacuum region 119. In cases where multiple lift pins are used, the plenum 134 provides a uniform suction rate for the cylindrical holes.

During operation, substrate bowing can be reduced by use of a pressure difference between the top and bottom surfaces of the substrate 118. The pressure in the vacuum region 119 is maintained under vacuum during operation by a vacuum pump 136 coupled to the plenum 134. By adjusting the gap between the upper dielectric plate 116 and the top surface of the substrate 118, the gas pressure in the gap can be varied without changing the overall flow rate of the process gas(es). Thus, by controlling the gas pressure in the gap, the pressure difference between the top and bottom surfaces of the substrate 118 can be varied and thereby the bending force applied on the substrate 118 can be controlled.

In some examples, the lower portion 138b of the bottom dielectric ring has a step 152 formed on the inner periphery of its upper surface to mate with a recess on a lower edge of the powered electrode 126. In some examples, the lower portion 138b has a step 150 formed on its outer periphery to mate with a stepped surface on the upper portion 138a of the bottom dielectric ring, referred to as a focus ring. The steps 150, 152 align the bottom dielectric ring 138 with the powered electrode 126. The step 150 also forms a tortuous gap along the surface thereof to eliminate the direct line-of-sight between the powered electrode 126 and the chamber wall 102 thereby reducing the possibility of a secondary plasma strike between the powered electrode 126 and the chamber wall 102.

A controller 190 controls operation of the substrate processing system 100. The controller communicates with a gas delivery system 192 to deliver gases to the substrate processing system 100 at the appropriate times during a process. The controller 190 communicates with and controls the vacuum pumps 136 and 143 to control pressure in the substrate processing system. The controller 190 communicates with and controls the robot 133. The controller 190 communicates with and controls the RF power sources 170 and 171.

Referring now to FIG. 2, another arrangement of components of a bevel etcher 200 is shown. The bevel etcher 260 includes upper and lower PEZ rings 202 and 204, respectively. The upper and lower PEZ rings 202 and 204 have annular bodies and are located in close proximity to a substrate 205 above and below a radially outer edge of the substrate 205, respectively. A radially outer end of the substrate 205 projects into a plasma treatment zone 207 beyond radially outer surfaces of the upper and lower PEZ rings 202 and 204. As a result, the upper and lower surfaces of the substrate 205 at a radially outer edge are directly exposed to the plasma during bevel etching.

Upper and lower electrodes 206 and 208 are arranged adjacent to and radially outside of the upper and lower PEZ rings 202 and 204, respectively. RF power is applied across the upper and lower electrodes 202 and 204 while plasma gas is supplied to create plasma. A lower isolation ring 210 is located below the lower PEZ ring 204 and the lower electrode 208. A dielectric plate 212 is arranged above the substrate 205 at a location radially inward from the upper PEZ ring 202. A cooling plate 224 is arranged above the upper PEZ ring 202, the upper electrode 206, and the dielectric plate 212. A lower electrode plate 220 is arranged below the substrate 205.

In FIG. 3, a lower PEZ ring 260 has an annular body. The lower PEZ ring 260 is arranged below a substrate 270 and extends in a horizontal direction beyond an apex 274 (or a radially outer edge) of the substrate 270. The lower PEZ ring 260 is arranged below the substrate 270 and between a lower electrode plate 264 and a lower electrode 266. The lower PEZ ring 260 is annular and includes one or more stair steps generally shown at 272. A bottom surface of the substrate 270 rests on an uppermost one of the stair steps 272 near the apex 274 of the substrate 270. In other words, the bottom surface near the apex 274 of the substrate 270 is not cantilevered as shown in FIGS. 1 and 2. As can be seen, ions 278 generated by the plasma 228 are incident upon the apex 274 of the substrate 270. While less etching of the bottom surface of the substrate 270 occurs, the apex 274 and other portions near the radially outer surface of the substrate 270 are still etched.

Referring now to FIGS. 4 and 5, a lower plasma exclusion zone (PEZ) ring 310 is shown. The lower PEZ ring 310 is arranged between the lower electrode plate 264 and another electrode 266. The lower PEZ ring 310 is annular and defines an pocket 312 for receiving the substrate 270. The pocket 312 has a vertical pocket depth that is greater than or equal to one half of a thickness of the substrate 270 and a diameter that is greater than a diameter of the substrate 270. The lower PEZ ring 310 includes a lower portion 314 including one or more stair steps 322. A bottom surface of the substrate 270 partially rests on an uppermost one of the stair steps 322 near a radially outer edge of the substrate 270. The first one of the stair steps 322 includes a first laterally extending upper surface that extends radially outward from a first radially inner annular ridge 323. The second one of the stair steps 322 includes a second laterally extending upper surface that extends radially outward from a second radially inner annular ridge 325. The upper (or uppermost) surface 318 of the upwardly projecting annular flange 320 extends radially outward from a third radially inner annular ridge 327.

The lower PEZ ring 310 further includes an upwardly-projecting annular flange 320 that extends upwardly from the lower portion 314. In some examples, the upwardly-projecting annular flange 320 extends vertically to a plane located at or above a middle portion of the substrate 270 in a vertical direction. In some examples, the upwardly-projecting annular flange 320 extends to a plane located at or above a top surface of the substrate in a vertical direction.

In some examples, a gap (defined in a horizontal direction) between the apex 274 of the substrate 270 and an adjacent surface 321 of the upwardly-projecting annular flange 320 is in a range from 0.1 to 1 mm. In some examples, the gap between the apex 274 of the substrate 270 and the adjacent surface 321 of the upwardly-projecting annular flange 320 is in a range from 0.1 to 0.5 mm.

A concave curved portion 316 may be located adjacent to a lower, radially outer edge of the substrate 270 below the apex 274. The concave curved portion 316 is a transition surface from the second (or upper) stair step 322 to the adjacent surface 321, which extends vertically from the second stair step 322 to the upper surface 318. An upper surface 318 of the upwardly-projecting annular flange 320 may be located a distance d1 above a plane defined by a lower surface of the substrate 270 where d1>=d2/2, where d2 is equal to the thickness of the substrate. In other examples, d1>=d2. In some examples, the thickness of the substrate d2 is in a range from 50 microns to 2 mm. In other examples, the thickness of the substrate d2 is in a range from 50 microns to 1.25 mm. In some examples, the lower PEZ ring 310 is made of alumina ($Al_2O_3$) or yttria ($Y_2O_3$).

The substrate 270 can have different configurations. In some examples, the substrate 270 includes a single substrate as shown in FIGS. 2-4. Alternately, the substrate includes a first substrate 350 bonded or otherwise attached to a carrier substrate 352 as shown in FIG. 5.

As can be seen in FIG. 4, ions 278 generated by the plasma 228 are partially blocked by the upwardly projecting annular flange such that the ions are incident upon the bevel edge 274 of the substrate 270 in a region above the apex 274. As a result, selected regions from the apex 274 to the top surface near the radially outer surface of the substrate 270 are etched and lower regions are not.

As can be seen in FIG. 5, ions 278 generated by the plasma 228 are partially blocked by the upwardly projecting annular flange such that the ions are incident upon the first substrate 350 rather than the carrier substrate 352. As a result, selected regions near the radially outer end of the first substrate 350 are etched or trimmed and the carrier substrate 352 is not. As can be appreciated, the height of the upwardly projecting flange 320 can be varied to provide different etching effects.

Referring now to FIG. 6, another configuration of the lower PEZ ring is shown at 610. The lower PEZ ring 610 includes first, second and third steps at 614, 616 and 618, respectively, which increase in height. The first, second and third steps 614, 616 and 618 are arranged on a substrate-facing side of the lower PEZ ring 610. In some examples, an uppermost surface 620 of the step 618 is generally planar and lies in a plane that is parallel with a plane of the upper surface of the substrate 630. In some examples, the plane including the uppermost surface 620 is located at or above the plane including the upper surface of the substrate 630.

A radially inner portion of the uppermost surface 620 transitions to an arcuate surface 634 that slopes downwardly towards the second step 616. In some examples, the arcuate surface 634 helps to center the substrate 630 during placement.

Referring now to FIG. 7, another configuration of the lower PEZ ring is shown at 710. The lower PEZ ring 710 includes first, second and third annular steps at 714, 716 and 718 that increase in height. The first, second and third annular steps 714, 716 and 718 have respective laterally extending surfaces 715, 717, 720 and are arranged on a substrate-facing side of the lower PEZ ring 710. In some examples, the laterally extending surface 720 is an uppermost surface 720 of the third annular step 718 and is generally planar and lies in a plane that is parallel with a plane of the upper surface of the substrate 630. In some examples, the plane including the uppermost surface 620 is located at or above the plane including the upper surface of the substrate 630 during placement.

A radially inner surface of the third annular step 718 of the lower PEZ ring 710 defines a first pocket 733, a second pocket 735, and an annular ridge 736 and transitions downwardly towards the second annular step 716. The first pocket 733 has an arcuate surface 734, which is concave shaped and transitions at a precipice (referred to as the ridge) 736 located near the apex 274 of the bevel edge. In some examples, the arcuate surface 734 helps to center the substrate 730. The second pocket 735 has a surface 738 that transitions directly downward, downward and outward, or downward and inward towards the first step 714.

The lower PEZ ring 710 defines the first and second (or upper and lower) pockets 733 and 735. The lower pocket 735 has a depth that is greater than or equal to one half of a thickness of the substrate 630. The lower pocket 735 has a diameter that is greater than a diameter of the substrate 630. The upper pocket 733 has an inner diameter that is greater than a diameter of the lower pocket 735 and an outer diameter that is greater than the inner diameter. The arcuate surface 734 extends from the outer diameter of the upper pocket 733 to the inner diameter of the upper pocket 733.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for processing a substrate, comprising:
    an upper plasma exclusion zone ring arranged above the substrate during plasma treatment of a bevel edge of the substrate;
    an upper electrode arranged above the substrate during plasma treatment;
    a lower plasma exclusion zone ring at least partially arranged underneath the substrate during the plasma treatment; and
    a lower electrode at least partially arranged underneath the substrate during plasma treatment,
    wherein the lower plasma exclusion zone ring includes an annular body with:
        a lower portion, wherein the lower portion includes a first annular step comprising a first laterally extending upper surface and a second annular step comprising a second laterally extending upper surface and extending upwardly and radially outwardly from the first annular step; and
        an upwardly projecting flange extending upwardly from the second annular step of the lower portion of the annular body at a location spaced from a radially outer edge of the substrate, wherein the upwardly projecting flange includes a side surface extending vertically and adjacent the radially outer edge of the substrate to limit an amount of ions impinging upon a lower portion of the radially outer edge of the substrate, and an uppermost surface extending laterally towards a middle portion of the radially outer edge of the substrate.

2. The substrate processing system of claim 1, wherein the lower electrode is located at least partially underneath the lower plasma exclusion zone ring.

3. The substrate processing system of claim 1, wherein the uppermost surface of the upwardly projecting flange is planar.

4. The substrate processing system of claim 3, wherein an arcuate surface extends downwardly from a radially inner edge of the uppermost surface to a location adjacent to an apex of the radially outer edge of the substrate.

5. The substrate processing system of claim 3, wherein an arcuate surface extends downwardly from a radially inner edge of the uppermost surface to the lower portion of the annular body.

6. The substrate processing system of claim 1, wherein a gap is defined in a horizontal plane between an apex of the radially outer edge of the substrate and the side surface of the upwardly projecting flange, and wherein the gap has a width in a range from 0.1 to 1 mm.

7. The substrate processing system of claim 6, wherein the width is in a range from 0.1 to 0.5 mm.

8. The substrate processing system of claim 1, wherein the uppermost surface is located in a plane parallel to a plane including an upper surface of the substrate.

9. The substrate processing system of claim 1, wherein a thickness of the substrate is in a range from 50 microns to 2 mm.

10. The substrate processing system of claim 1, wherein the lower plasma exclusion zone (PEZ) ring is made of a material selected from a group consisting of alumina and yttria.

11. The substrate processing system of claim 1, wherein the substrate is attached to a carrier substrate.

12. A lower plasma exclusion zone ring for a bevel etcher, comprising:
   an annular body defining:
      a first annular step comprising a first laterally extending upper surface and located below and radially inwardly of a radially outer edge of a substrate; and
      a second annular step comprising a second laterally extending upper surface and extending upwardly and radially outwardly from the first annular step,
      wherein a transition between the first annular step and the second annular step is located radially inwardly of the radially outer edge of the substrate; and
   an upwardly projecting flange extending upwardly from the second laterally extending upper surface of the second annular step at a location radially outside of the substrate and not underneath the second laterally extending upper surface,
   wherein
      an upward extending surface of the upwardly projecting flange extends upwardly from the second laterally extending upper surface of the second annular step to a location horizontally adjacent to a middle portion of the radially outer edge of the substrate, and
      the upward extending surface extends from the second laterally extending upper surface to an uppermost surface of the upwardly projecting flange and not underneath the second laterally extending upper surface.

13. The lower plasma exclusion zone ring of claim 12, wherein the uppermost surface of the upwardly projecting flange lies in a plane parallel to a plane including an upper surface of the substrate.

14. The lower plasma exclusion zone ring of claim 12, wherein an arcuate surface extends downwardly and inwardly from a radially inner edge of the upwardly projecting flange to a location adjacent to an apex of the radially outer edge of the substrate.

15. The lower plasma exclusion zone ring of claim 12, wherein an arcuate surface extends downwardly and inwardly from a radially inner edge of the upwardly projecting flange to the second laterally extending upper surface of the second annular step.

16. The lower plasma exclusion zone ring of claim 12, wherein a gap is defined in a horizontal plane between an apex of the radially outer edge of the substrate and a radially inner surface of the upwardly projecting flange, and wherein the gap has a width in a range from 0.1 to 1 mm.

17. The lower plasma exclusion zone ring of claim 16, wherein the width is in a range from 0.1 to 0.5 mm.

18. The lower plasma exclusion zone ring of claim 12, wherein a thickness of the substrate is in a range from 50 microns to 2 mm.

19. The lower plasma exclusion zone ring of claim 12, wherein the annular body is made of a material selected from a group consisting of alumina and yttria.

20. A lower plasma exclusion zone ring for a bevel etcher, comprising:
   an annular body defining:
      a first annular step comprising a first laterally extending surface;
      a second annular step comprising a second laterally extending surface and extending upwardly and radially outwardly from the first annular step and configured to support a substrate; and
      a third annular step comprising a third laterally extending surface and extending upwardly and radially outwardly from the second annular step;
   wherein a radially inner surface of the third annular step between the second laterally extending surface and the third laterally extending surface defines:
      a first pocket;
      a second pocket located radially inwardly from and underneath the first pocket; and
      an annular ridge located between the first pocket and the second pocket.

21. The substrate processing system of claim 20, wherein the annular ridge, located between the first pocket and the second pocket, is arranged at or above an apex of a radially outer edge of the substrate.

22. The lower plasma exclusion zone ring of claim 20, wherein the second pocket is configured to support the substrate and the annular ridge is located at or above an apex of a radially outer edge of the substrate.

23. The lower plasma exclusion zone ring of claim 20, wherein an uppermost surface of the third annular step lies in a plane parallel to a plane including an upper surface of the substrate.

24. The lower plasma exclusion zone ring of claim 20, wherein a gap is defined in a horizontal plane between an apex of a radially outer edge of the substrate and the annular ridge, and wherein the gap has a width in a range from 0.1 to 1 mm.

25. The lower plasma exclusion zone ring of claim 24, wherein the width is in a range from 0.1 to 0.5 mm.

26. The lower plasma exclusion zone ring of claim 20, wherein a thickness of the substrate is in a range from 50 microns to 2 mm.

27. The lower plasma exclusion zone ring of claim 20, wherein the annular body is made of a material selected from a group consisting of alumina and yttria.

28. The substrate processing system of claim 1, wherein a height of the upwardly projecting flange measured from the second laterally extending upper surface to the uppermost surface is less than 2 mm.

29. The substrate processing system of claim 1, wherein a height of the upwardly projecting flange measured from the second laterally extending upper surface to the uppermost surface is less than 1 mm.

30. The substrate processing system of claim 1, wherein a height of the upwardly projecting flange measured from the second laterally extending upper surface to the uppermost surface is 25 microns to 1 mm.

31. The substrate processing system of claim 1, wherein the uppermost surface extends laterally towards a portion of the radially outer edge of the substrate between an apex of the radially outer edge and a top surface of the substrate.

32. The substrate processing system of claim 1, wherein the uppermost surface extends laterally towards a portion of the radially outer edge of the substrate between a top surface of the substrate and a point half a distance between a height of the top surface of the substrate and a height of a bottom surface of the substrate.

33. The substrate processing system of claim 1, wherein an upward extending surface of the upwardly projecting flange extends upward to and not past a point half a distance between a height of a top surface of the substrate and a height of a bottom surface of the substrate.

34. The substrate processing system of claim 1, further comprising the substrate.

35. The substrate processing system of claim 4, wherein the arcuate surface is a concave surface.

36. The substrate processing system of claim 5, wherein the arcuate surface is a concave surface.

37. The lower plasma exclusion zone ring of claim 12, wherein the upward extending surface extends upwardly from the second laterally extending upper surface of the second annular step to a location vertically adjacent to a location above an apex of the radially outer edge of the substrate.

38. The lower plasma exclusion zone ring of claim 12, wherein the upward extending surface extends upwardly from the second laterally extending upper surface of the second annular step to a location vertically adjacent to a point half a distance between a height of a top surface of the substrate and a height of a bottom surface of the substrate.

39. The lower plasma exclusion zone ring of claim 12, further comprising a transition surface extending downwardly and radially inwardly from an upwardly extending surface of the upwardly projecting flange to the second laterally extending upper surface of the second annular step.

40. The lower plasma exclusion zone ring of claim 12, wherein a portion of the upward extending surface of the upwardly projecting flange gradually transitions upwardly and outwardly between the second laterally extending upper surface of the second annular step to the uppermost surface of the upwardly projecting flange.

41. The lower plasma exclusion zone ring of claim 12, wherein the upward extending surface of the upwardly projecting flange is arcuate shaped.

42. The lower plasma exclusion zone ring of claim 12, further comprising a transition surface extending downwardly and radially inwardly from the upward extending surface of the upwardly projecting flange towards the middle portion of the radially outer edge of the substrate.

43. The lower plasma exclusion zone ring of claim 12, wherein a height of the upwardly projecting flange measured from the second laterally extending upper surface to the uppermost surface of the upwardly projecting flange is less than 2 mm.

44. The lower plasma exclusion zone ring of claim 12, wherein a height of the upwardly projecting flange measured from the second laterally extending upper surface to the uppermost surface of the upwardly projecting flange is less than 1 mm.

45. The lower plasma exclusion zone ring of claim 12, wherein a height of the upwardly projecting flange measured from the second laterally extending upper surface to the uppermost surface of the upwardly projecting flange is 25 microns to 1 mm.

46. The lower plasma exclusion zone ring of claim 12, wherein:
the first laterally extending upper surface comprises a first radially inner annular ridge;
the second laterally extending upper surface comprises a second radially inner annular ridge; and
the uppermost surface of the upwardly projecting flange comprises a third radially inner annular ridge.

47. The lower plasma exclusion zone ring of claim 20, wherein the first annular step is configured to support a lower electrode of the bevel etcher.

48. The lower plasma exclusion zone ring of claim 20, wherein the annular ridge extends laterally around the substrate.

49. The lower plasma exclusion zone ring of claim 20, wherein the annular ridge extends laterally around the substrate adjacent to an apex of a radially outer edge of the substrate.

50. The lower plasma exclusion zone ring of claim 20, wherein:
the first laterally extending surface comprises a first radially inner annular ridge;
the second laterally extending surface comprises a second radially inner annular ridge;
an uppermost surface of the upwardly projecting flange comprises a third radially inner annular ridge; and
the first pocket and the second pocket are disposed between the second radially inner annular ridge and the third radially inner annular ridge.

51. The lower plasma exclusion zone ring of claim 1, wherein the lower portion of the lower plasma exclusion zone ring extends adjacent to the lower electrode, which supports the substrate.

52. The lower plasma exclusion zone ring of claim 12, wherein the lower plasma exclusion zone ring at least one of excludes and controls a plasma profile at the radially outer edge of the substrate.

53. A substrate processing system comprising:
the lower plasma exclusion zone ring of claim 12; and
the substrate.

54. A lower plasma exclusion zone ring for a bevel etcher, comprising:
an annular body defining:
a first annular step comprising a first laterally extending surface;
a second annular step comprising a second laterally extending surface and extending upwardly and radially outwardly from the first annular step and configured to support a substrate; and a third annular step comprising a third laterally extending surface and extending upwardly and radially outwardly from the second annular step,
wherein
the third annular step comprises a vertically extending surface and a transition surface,
the vertically extending surface extends from the transition surface upward to the third laterally extending surface, and
the transition surface is shaped to center the substrate relative to the annular body and extends outward from the second laterally extending surface to the vertically extending surface.

55. The lower plasma exclusion zone ring of claim 54, wherein the transition surface slopes downwards.

56. The lower plasma exclusion zone ring of claim 54, wherein the transition surface is an arcuate surface.

57. The substrate processing system of claim 1, wherein the second annular step of the lower portion supports the substrate.

58. The lower plasma exclusion zone ring of claim 12, wherein the second laterally extending upper surface supports the substrate.

* * * * *